United States Patent
Hiraoka

(10) Patent No.: US 12,142,465 B2
(45) Date of Patent: Nov. 12, 2024

(54) PLASMA PROCESSING METHOD AND PLASMA PROCESSING APPARATUS

(71) Applicant: Tokyo Electron Limited, Tokyo (JP)

(72) Inventor: Sho Hiraoka, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 163 days.

(21) Appl. No.: 17/823,598

(22) Filed: Aug. 31, 2022

(65) Prior Publication Data

US 2023/0072102 A1 Mar. 9, 2023

(30) Foreign Application Priority Data

Sep. 9, 2021 (JP) ................................. 2021-147135

(51) Int. Cl.
*H01J 37/32* (2006.01)

(52) U.S. Cl.
CPC .. *H01J 37/32724* (2013.01); *H01J 37/32449* (2013.01); *H01J 37/32706* (2013.01); *H01J 37/32981* (2013.01)

(58) Field of Classification Search
CPC ............. H01J 37/32009; H01J 37/3244; H01J 37/32449; H01J 37/32697; H01J 37/32706; H01J 37/32715; H01J 37/32724; H01J 37/32981
See application file for complete search history.

(56) References Cited

U.S. PATENT DOCUMENTS 6,125,025 A * 9/2000 Howald .............. H01L 21/6833
279/128
2004/0235304 A1* 11/2004 Oh .................... H01J 37/32935
438/689

FOREIGN PATENT DOCUMENTS

| CN | 109075110 A | * 12/2018 | ............. C23C 16/46 |
| JP | 2018-206935 | 12/2018 | |

* cited by examiner

*Primary Examiner* — Jimmy T Vu
(74) *Attorney, Agent, or Firm* — IPUSA, PLLC

(57) ABSTRACT

A plasma processing method is disclosed that includes (a) placing a substrate on an electrostatic chuck at a first temperature, the electrostatic chuck being disposed in a plasma processing chamber; (b) electrostatically attracting the substrate to the electrostatic chuck; (c) starting supply of a heat transfer gas between the substrate and the electrostatic chuck; (d) detecting a flow rate of the heat transfer gas or a pressure between the substrate and the electrostatic chuck; (e) determining whether the flow rate or the pressure exceeds a predetermined threshold value; (f) raising the temperature of the electrostatic chuck until the temperature of the electrostatic chuck becomes a second temperature, the second temperature being higher than the first temperature; and (g) generating plasma in the plasma processing chamber.

11 Claims, 11 Drawing Sheets

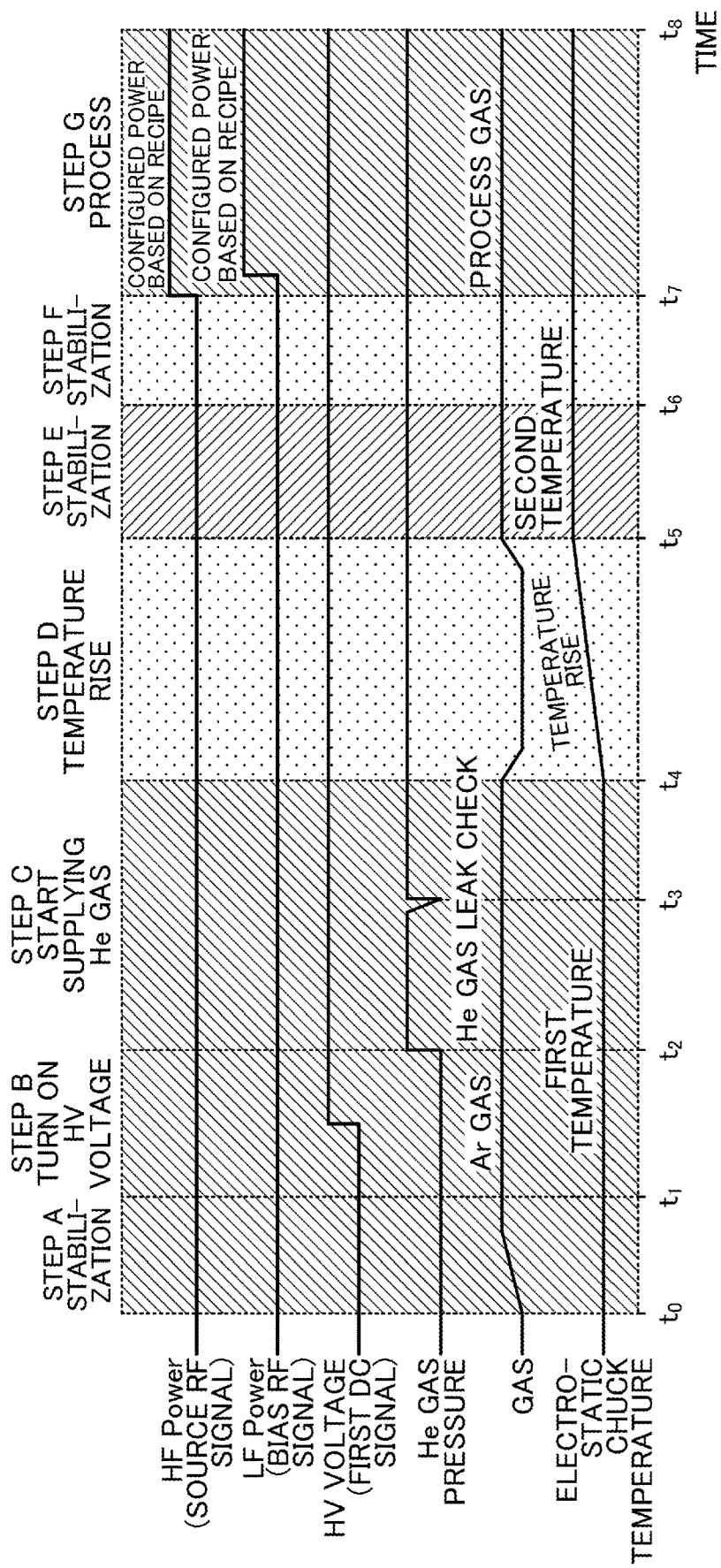

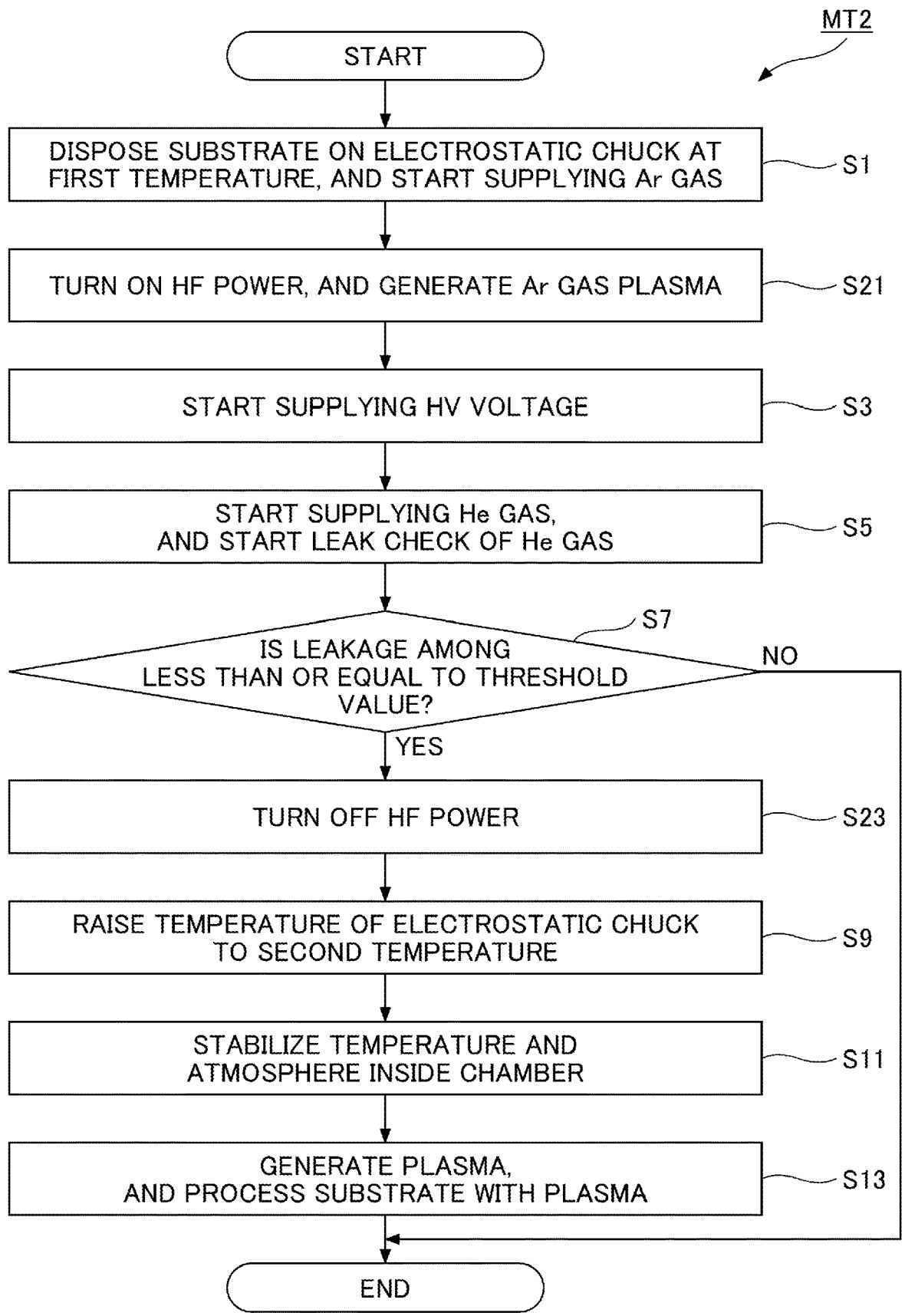

PLASMA PROCESSING METHOD AND PLASMA PROCESSING APPARATUS

CROSS-REFERENCE TO RELATED APPLICATIONS

This patent application is based on and claims priority to Japanese Patent Application No. 2021-147135, filed on Sep. 9, 2021, the entire contents of which are incorporated herein by reference.

TECHNICAL FIELD

The present disclosure relates to a plasma processing method and a plasma processing apparatus.

BACKGROUND

In an environment in which an electrostatic chuck is at a high temperature, if a time period for plasma processing is prolonged, a migration of electric charges into a dielectric in a dielectric film included in the electrostatic chuck tends to occur, and, thus, attraction force of the electrostatic chuck tends to be decreased (e.g., Patent Document 1).

RELATED ART DOCUMENT

Patent Document

[Patent Document 1] Japanese Patent Application Publication No. 2018-206935

SUMMARY

The present disclosure provides a technique for suppressing a decrease in attraction force of an electrostatic chuck caused by a migration. According to an aspect of the present disclosure, there is provided a plasma processing method including (a) placing a substrate on an electrostatic chuck at a first temperature, the electrostatic chuck being disposed in a plasma processing chamber; (b) electrostatically attracting the substrate to the electrostatic chuck; (c) starting supply of a heat transfer gas between the substrate and the electrostatic chuck; (d) detecting a flow rate of the heat transfer gas or a pressure between the substrate and the electrostatic chuck; (e) determining whether the flow rate or the pressure exceeds a predetermined threshold value; (f) raising the temperature of the electrostatic chuck until the temperature of the electrostatic chuck becomes a second temperature, the second temperature being higher than the first temperature; and (g) generating plasma in the plasma processing chamber.

BRIEF DESCRIPTION OF THE DRAWINGS

FIG. 7 is a time chart illustrating an example of the plasma processing method according to the embodiment.

FIG. 9 is a flowchart illustrating an example of a plasma processing method according to an embodiment.

DETAILED DESCRIPTION OF EMBODIMENTS

Embodiments for implementing this disclosure are described below with reference to the drawings. In each drawing, the same component parts are given the same symbols, and duplicate descriptions may be omitted.

[Plasma Processing System]

Figure 1:
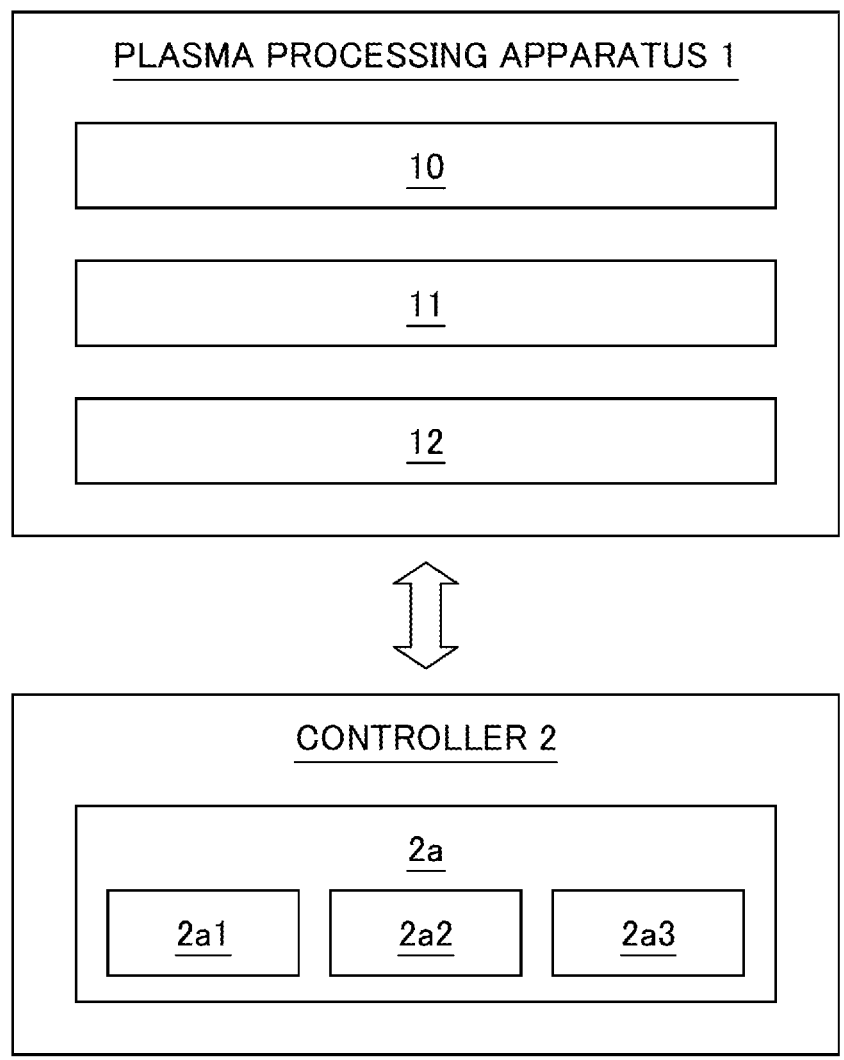
FIG. 1 is a diagram illustrating an example of a plasma processing system according to an embodiment.

In an embodiment, the plasma processing system illustrated in FIG. 1 includes a plasma processing apparatus 1 and a controller 2. The plasma processing apparatus 1 includes a plasma processing chamber 10, a substrate support 11, and a plasma generator 12. The plasma processing chamber 10 has a plasma processing space. The plasma processing chamber 10 also has at least one gas supply port for supplying at least one processing gas to the plasma processing space and at least one gas exhaust port for exhausting the gas from the plasma processing space. The gas supply port is connected to the gas supply 20 described below, and the gas exhaust port is connected to the exhaust system 40 described below. The substrate support 11 is disposed in the plasma processing space and has a substrate support surface to support the substrate.

The plasma generator 12 is configured to generate plasma from at least one processing gas supplied within the plasma processing space. The plasma formed in the plasma processing space may be capacitively coupled plasma (CCP), inductively coupled plasma (ICP), electron-cyclotron-resonance plasma (ECR), helicon wave plasma (HWP), surface wave plasma (SWP), or the like. Various types of plasma generators may also be used, including an alternating current (AC) plasma generator and a direct current (DC) plasma generator. In one embodiment, an AC signal (AC power) used in the AC plasma generator has a frequency in a range from 100 kHz to 10 GHz. Thus, the AC signal includes a radio frequency (RF) signal and a microwave signal. In one embodiment, the RF signal has a frequency in a range from 200 kHz to 150 MHz.

The controller 2 processes computer-executable instructions that cause the plasma processing apparatus 1 to execute the various processes described in this disclosure. The controller 2 may be configured to control each element of the plasma processing apparatus 1 to perform the various processes described in this disclosure. In one embodiment, some or all of the controller 2 may be included in the plasma processing apparatus 1. The controller 2 may include, for example, a computer $2a$. The computer $2a$ may include, for example, a central processing unit (CPU) $2a1$, a memory $2a2$, and a communication interface $2a3$. The processing unit $2a1$ can be configured to perform various control operations based on programs and recipes stored in the memory $2a2$. The memory $2a2$ may include a random access memory (RAM), a read only memory (ROM), a hard disk drive (HDD), a solid state drive (SSD), or a combination thereof. The communication interface $2a3$ may communicate with the plasma processing apparatus 1 via a communication line, such as a Local Area Network (LAN).

Figure 2:
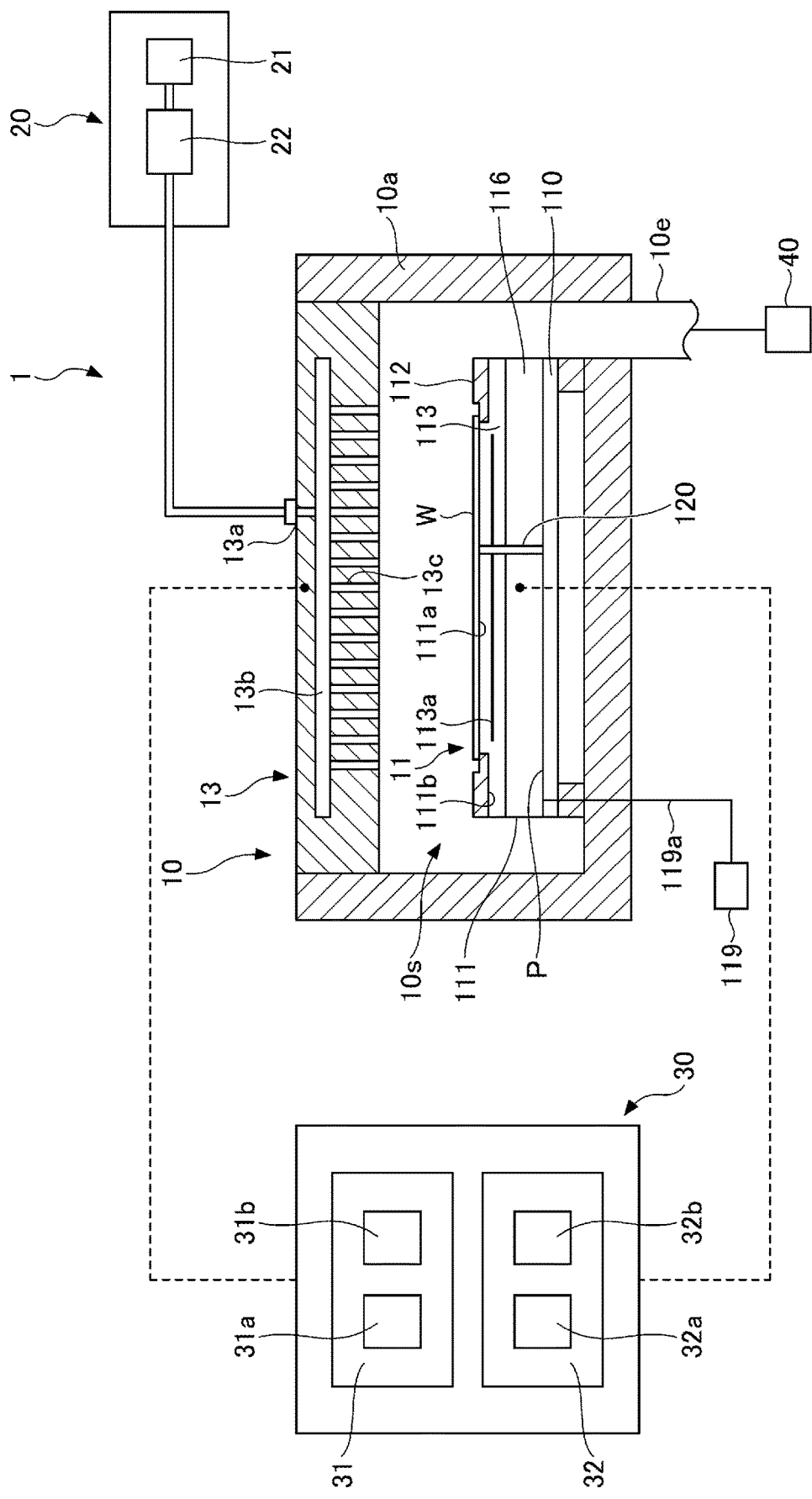
FIG. 2 is a schematic diagram illustrating a cross section of an example of a plasma processing apparatus according to an embodiment.

Next, a configuration example of a capacitively coupled plasma processing apparatus 1 is described with reference to FIG. 2, as an example of the plasma processing apparatus 1. The plasma processing apparatus 1 includes the plasma processing chamber 10, the gas supply 20, a power supply 30, and the exhaust system 40. The plasma processing apparatus 1 also includes the substrate support 11 and a gas introduction part. The gas introduction part is configured to introduce at least one processing gas into the plasma processing chamber 10. The gas introduction part includes a showerhead 13. The substrate support 11 is disposed within the plasma processing chamber 10. The showerhead 13 is disposed above the substrate support 11. In one embodiment, the showerhead 13 forms at least a portion of a ceiling of the plasma processing chamber 10. The plasma processing chamber 10 has a plasma processing space 10s defined by the showerhead 13, a side wall 10a of the plasma processing chamber 10, and the substrate support 11. The side wall 10a is grounded. The showerhead 13 and the substrate support 11 are electrically isolated from an enclosure of the plasma processing chamber 10.

The substrate support 11 includes a main body 111 and a ring assembly 112. The main body 111 includes a central region (substrate support surface) 111a for supporting a substrate (wafer) W and an annular region (ring support surface) 111b for supporting the ring assembly 112. The annular region 111b of the main body 111 surrounds the central region 111a of the main body 111 in a plan view. The substrate W is disposed on the central region 111a of the main body 111, and the ring assembly 112 is disposed on the annular region 111b of the main body 111 to surround the substrate W on the central region 111a of the main body 111. In one embodiment, the main body 111 includes a base and an electrostatic chuck. The base includes an electrically conductive member. The electrically conductive member of the base serves as a lower electrode. The electrostatic chuck is disposed on the base. A top surface of the electrostatic chuck includes a substrate support surface 111a. The ring assembly 112 includes one or more annular members. At least one of one or more annular members is an edge ring. The substrate support 11 may include a temperature control module configured to adjust a temperature of at least one of the electrostatic chuck, the ring assembly 112, and the substrate to the target temperature. Here, the depiction of the temperature control module is omitted. The temperature control module may include a heater, a heat transfer medium, a flow channel, or a combination thereof. Heat transfer fluids, such as brine and a gas, flow through the flow channel. The substrate support 11 may also include a heat transfer gas supply configured to supply a heat transfer gas between a back side of the substrate W and the substrate support surface 111a.

The showerhead 13 is configured to introduce at least one processing gas from the gas supply 20 into the plasma processing space 10s. The showerhead 13 includes at least one gas supply port 13a, at least one gas diffusion chamber 13b, and a plurality of gas introduction ports 13c. The processing gas supplied to the gas supply port 13a passes through the gas diffusion chamber 13b and is introduced into the plasma processing space 10s from the plurality of gas introduction ports 13c. The showerhead 13 also includes an electrically conductive member. The electrically conductive member of the showerhead 13 functions as an upper electrode. In addition to the showerhead 13, the gas introduction part may include one or more side gas injectors (SGI) attached to one or more openings formed in the side wall 10a.

The gas supply 20 may include at least one gas source 21 and at least one flow rate controller 22. In an embodiment, the gas supply 20 is configured to supply at least one processing gas from the corresponding gas source 21 to the showerhead 13 via the corresponding flow rate controller 22. Each flow rate controller 22 may include, for example, a mass flow rate controller or a pressure-controlled flow rate controller. In addition, the gas supply 20 may include at least one flow rate modulation device that modulates or pulses a flow rate of at least one processing gas.

The power supply 30 includes an RF power supply 31 coupled to the plasma processing chamber 10 through at least one impedance matching circuit. The RF power supply 31 is configured to supply at least one RF signal (RF power), such as a source RF signal and a bias RF signal, to the electrically conductive member of the substrate support 11 and/or the electrically conductive member of the showerhead 13. Thus, plasma is formed from at least one processing gas supplied to the plasma processing space 10s. Accordingly, the RF power supply 31 can function as at least a part of the plasma generator 12. Furthermore, by supplying the bias RF signal to the electrically conductive member of the substrate support 11, a bias potential is generated in the substrate W, and the ion components in the formed plasma can be drawn into the substrate W.

In an embodiment, the RF power supply 31 includes a first RF generator 31a and a second RF generator 31b. The first RF generator 31a is coupled to the electrically conductive member of the substrate support 11 and/or the electrically conductive member of the showerhead 13 via at least one impedance matching circuit and is configured to generate a source RF signal (source RF power) for plasma generation. In one embodiment, the source RF signal has a frequency in the range from 13 MHz to 150 MHz. In one embodiment, the first RF generator 31a may be configured to generate multiple source RF signals with different frequencies. The generated one or more source RF signals are supplied to the electrically conductive member of the substrate support 11 and/or the electrically conductive member of the showerhead 13. The second RF generator 31b is coupled to the electrically conductive member of the substrate support 11 via at least one impedance matching circuit and is configured to generate a bias RF signal (bias RF power). In one embodiment, the biased RF signal has a frequency that is lower than the frequency of the source RF signal. In one embodiment, the biased RF signal has a frequency in the range from 400 kHz to 13.56 MHz. In one embodiment, the second RF generator 31b may be configured to generate multiple biased RF signals with different frequencies. The generated one or more bias RF signals are supplied to the electrically conductive member of the substrate support 11. Furthermore, in various embodiments, at least one of the source RF signal and the bias RF signal may be pulsed.

The power supply 30 may also include a DC power supply 32 coupled to the plasma processing chamber 10. The DC power supply 32 includes a first DC generator 32a and a second DC generator 32b. In an embodiment, the first DC generator 32a is connected to an electrically conductive member of the substrate support 11 and configured to generate a first DC signal. The generated first DC signal is applied to the electrically conductive member of the substrate support 11. In this embodiment, the first DC signal is applied to an attraction electrode 113a in the electrostatic chuck 113. In an embodiment, the second DC generator 32b is connected to an electrically conductive member of the showerhead 13 and configured to generate a second DC signal. The generated second DC signal is applied to the electrically conductive member of the showerhead 13. In various embodiments, the first DC signal and the second DC signal may be pulsed. The first DC generator 32a and the second DC generator 32b may be provided in addition to the RF power supply 31, or the first DC generator 32a may be provided instead of the second RF generator 31b.

The exhaust system 40 may be connected, for example, to a gas exhaust port 10e provided at the bottom of the plasma processing chamber 10. The exhaust system 40 may include a pressure regulating valve and a vacuum pump. A pressure regulating valve regulates the pressure in the plasma processing space 10s. The vacuum pump may include a turbo-molecular pump, a dry pump or a combination thereof.

[Heat Transfer Gas Flow Channel]

The electrostatic chuck 113 is provided with the attraction electrode 113a. The attraction electrode 113a is connected to the first DC generator 32a, and a first DC signal (DC voltage) is applied from the first DC generator 32a. As a result, the substrate W is attracted to and held by the electrostatic chuck 113.

The substrate support 11 is an example of a member provided with an electrode to which a desired high-frequency power is applied. However, the substrate support 11 need not have the electrostatic chuck 113 and the attraction electrode 113a. An electrically conductive member of the base 116 to which at least one RF signal (RF power, high frequency power) is coupled from the first RF generator 31a and/or the second RF generator 31b may be used as an electrode (lower electrode) included in the substrate support 11.

In this disclosure, helium (He) gas is supplied between the substrate support surface 111a of the electrostatic chuck 113 and the back surface of the substrate W, as an example of heat transfer gas. However, the heat transfer gas is not limited to helium gas and may be an inert gas other than the helium gas. The substrate support 11 has a through-hole 120 that passes through the substrate support 11 in the thickness direction. The through-hole 120 serves as a flow channel for the helium gas.

The main body 111 includes an electrically conductive plate 110 that supports the base 116. The plate 110 is disposed below the base 116. There is a gap between the lower surface of the base 116 and the top surface of the plate 110. The gap forms a gas flow channel P. The through-hole 120 communicates with the gas flow channel P. The gas flow channel P is connected to a He gas source 119 via a He gas supply line 119a. Helium gas supplied from the He gas source 119 flows through the gas flow channel P via the He gas supply line 119a and the helium gas is supplied through the through-hole 120 to the gap between the substrate support surface 111a and the back surface of the substrate W.

[Flow Rate Monitoring]

Figure 3:
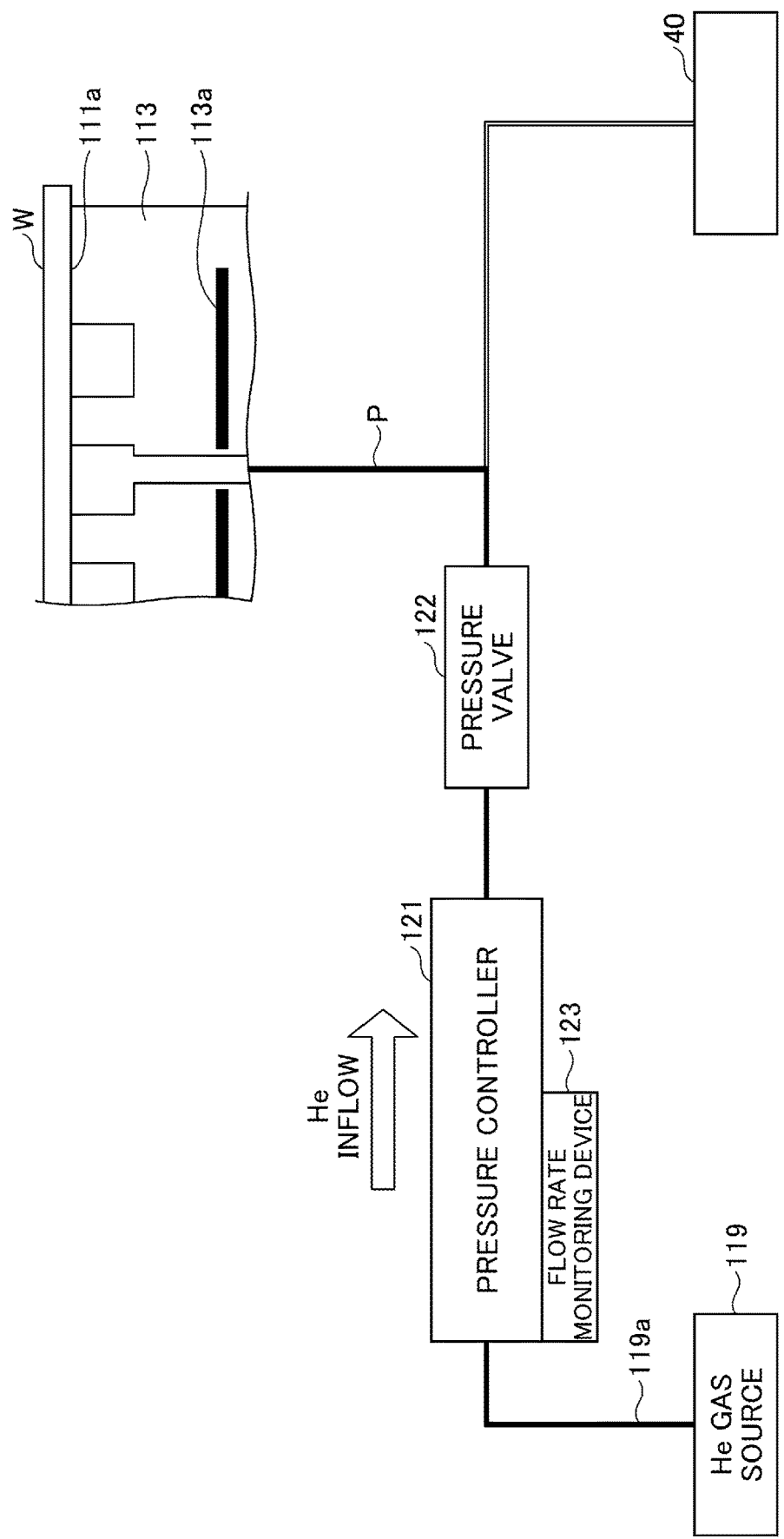
FIG. 3 is a diagram illustrating an example of a flow rate monitor according to an embodiment.

Next, the flow rate monitoring of He gas according to an embodiment is described with reference to FIG. 3. FIG. 3 is a diagram illustrating an example of the flow rate monitoring device 123 according to the embodiment. The flow monitoring device 123 is attached to the pressure controller 121.

In the He gas supply line 119a, a pressure valve 122, the pressure controller 121, and the flow rate monitoring device 123 are installed in this order from the substrate support 11. The flow rate of He gas supplied from the He gas source 119 is controlled in accordance with a valve opening position of the pressure valve 122 controlled by the pressure controller 121. The flow rate of the He gas is controlled, the He gas flows through the gas flow channel P, and the He gas is supplied to the gap between the substrate support surface 111a and the back surface of the substrate W. The pressure controller 121 detects the pressure between the substrate W and the electrostatic chuck 113.

The flow rate monitoring device 123 detects the flow rate of the He gas flowing through the He gas supply line 119a. The flow rate monitoring device 123 monitors the flow rate of the He gas supplied to the gap between the substrate support surface 111a and the back surface of the substrate W by detecting the flow rate of the He gas flowing through the He gas supply line 119a.

The flow monitoring device 123 performs a leak check of the He gas supplied to the gap between the substrate support surface 111a and the back surface of the substrate W. A leak check is a process to check whether the flow rate of He gas supplied to the gap between the substrate support surface 111a and the back surface of the substrate W is within the proper range. If the substrate W is attracted to the substrate support surface 111a with an appropriate attraction force, He gas flows at a predetermined flow rate. However, when the attraction force of the substrate becomes weak, the He gas is supplied to the gap between the substrate W and the substrate support surface 111a at a flow rate that is greater than the predetermined flow rate. Accordingly, the cooling performance of the substrate W by the He gas becomes unstable. Accordingly, it is possible to inspect whether the attraction force of the substrate W is appropriate by the leak check. As described below, instead of performing leak check by detecting the flow rate of He gas, a leak check may be performed by detecting the pressure between the substrate support surface 111a and the back surface of the substrate W.

For the leak check to detect the flow rate of the He gas, the supply of the He gas from the He gas source 119 is started (turned on), and the supply of the He gas is stopped (turned off) after a predetermined time period elapses. If the He gas is leaking, the pressure between the substrate support surface 111a and the back surface of the substrate W decreases when the supply of the He gas is turned off. Accordingly, the He gas from the He gas source 119 that is turned on again is supplied at a greater flow rate so as to adjust the pressure. Thus, if the He gas is leaking, the flow rate of the He gas detected by the flow monitoring device 123 is greater than a flow rate of He gas in a case where the He gas is not leaking. Accordingly, if the detected flow rate of the He gas exceeds a preset threshold value, it can be determined that the He gas is leaking.

[Migration]

For example, a failure in attraction may occur when the electrostatic chuck 113 is used at approximately 250° C. The failure in attraction refers to a phenomenon in which the attraction force of the substrate W to the electrostatic chuck 113 decreases. One of the reasons that the failure in attraction occurs when the electrostatic chuck 113 is used at a temperature higher than or equal to 100° C. is that volume resistivity of a ceramic plate included in the electrostatic chuck 113 decreases due to the temperature rise in the electrostatic chuck 113. When the volume resistivity of the ceramic plate decreases, electrons tend to transfer from the substrate W to the attraction electrode 113a, so that the amount of the charges for ensuring the attraction force decreases due to the transfer of the electrons. Accordingly, in order to suppress the decrease in the attraction force of the electrostatic chuck 113, it is important to reduce the effect of the migration.

Figure 4:
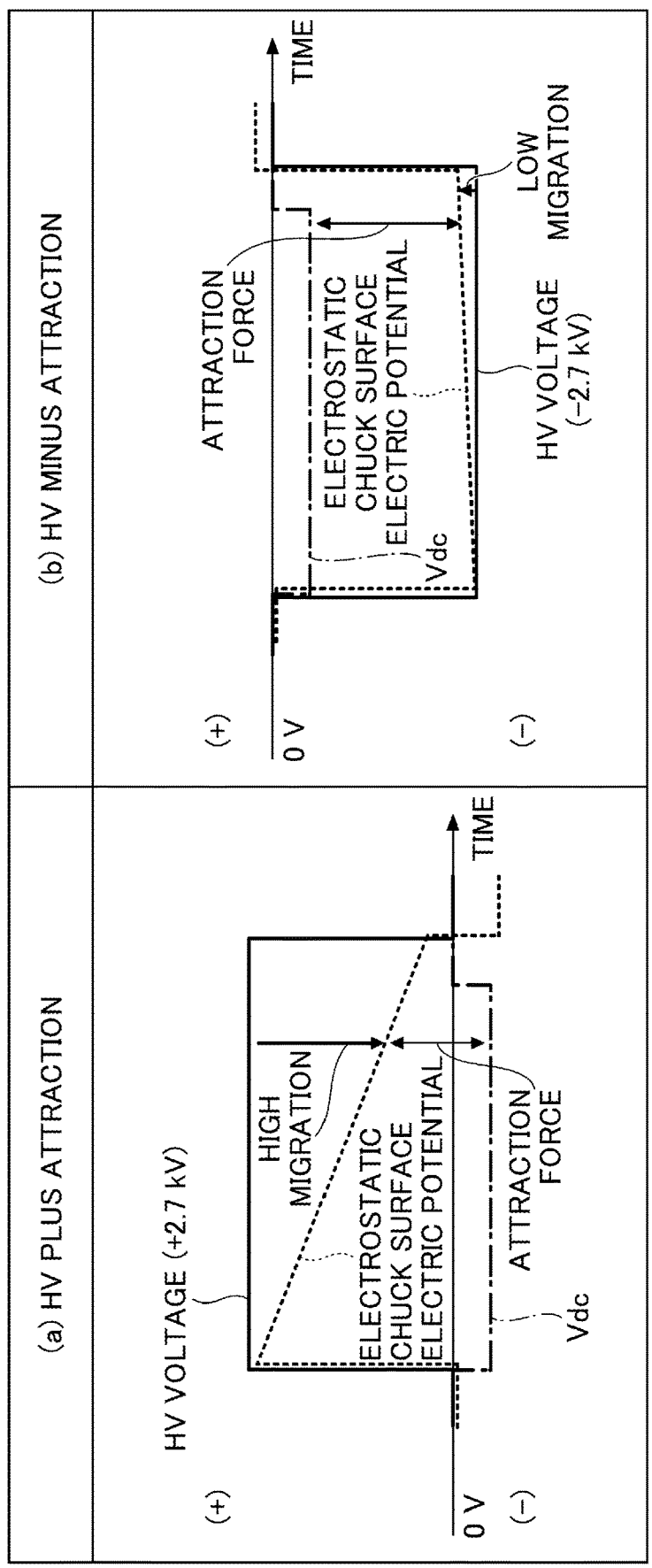
FIG. 4 is a diagram illustrating a decrease in attraction force of an electrostatic chuck caused by a migration.
Figure 5A:
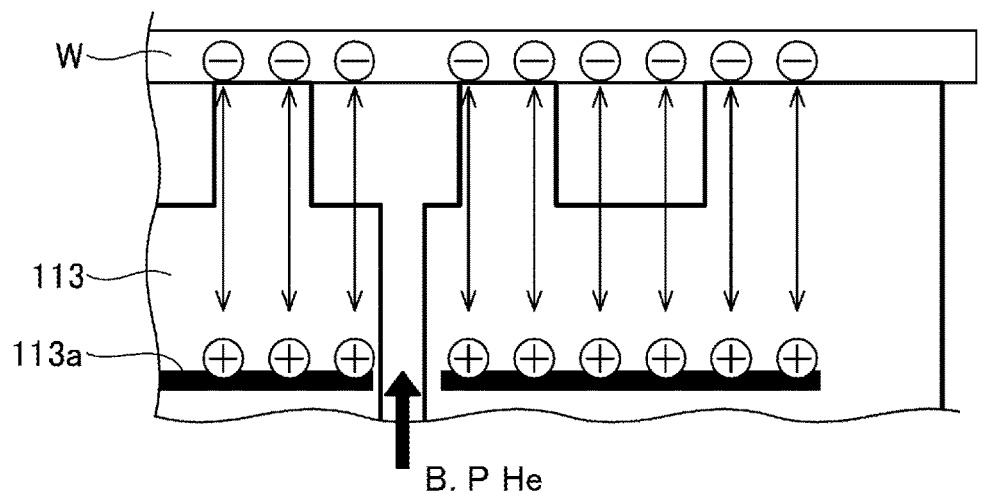
FIGS. 5A-5C are diagrams illustrating transfer of electric charges in the migration.
Figure 5B:
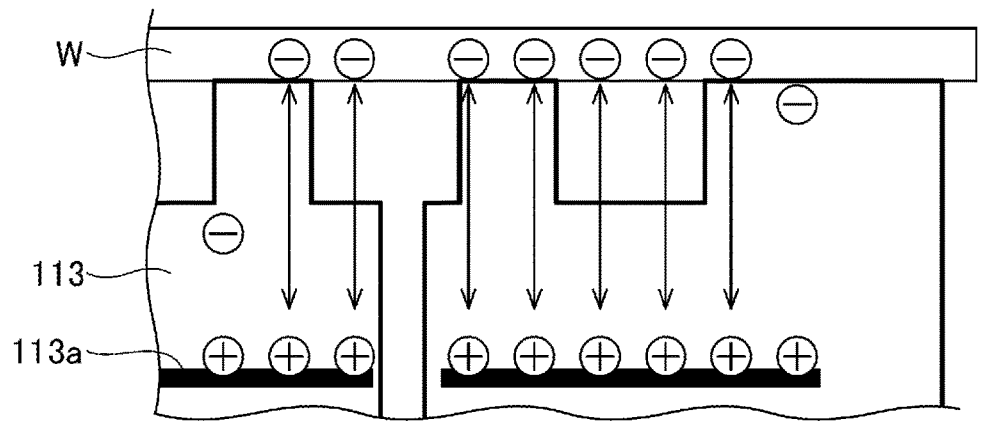
Figure 5C:
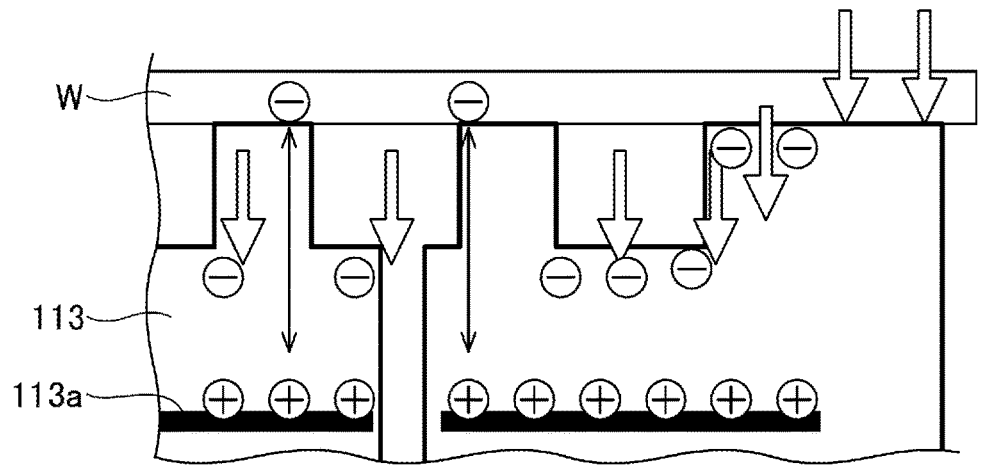

With reference to FIG. 4 and FIG. 5, the migration is described (a) in a case where positive charges are supplied to the attraction electrode 113a, and (b) in a case where negative charges are supplied to the attraction electrode 113a. FIG. 4 is a diagram illustrating the decrease in the attraction force of the electrostatic chuck 113 due to migration. FIGS. 5A through 5C are diagrams illustrating the transfer of charges by the migration.

As illustrated in (a) of FIG. 4, when positive charges are supplied to the attraction electrode 113a (HV plus attraction), the first DC signal generated by the first DC generator 32a applies a positive direct current voltage (HV voltage) to the attraction electrode 113a. As a result, for example, the HV voltage of 2.7 kV is supplied to the attraction electrode 113a. FIG. 5A schematically illustrates that the positive charges on the attraction electrode 113a and the negative charges on the substrate W attract to produce the normal attraction force.

As the time indicated in the horizontal axis in (a) of FIG. 4 elapses, the surface potential of the electrostatic chuck 113 decreases as indicated by the voltage (potential) on the vertical axis. The reason is that when the electrostatic chuck 113 is at a temperature higher than or equal to 100° C., the volume resistivity of the ceramic plate included in the electrostatic chuck 113 decreases. As a result, electrons charged on the substrate W tend to move from the substrate W to the attraction electrode 113a as time elapses, as illustrated in FIG. 5B to FIG. 5C. The attraction force of the substrate W at this time is calculated from the following equation (1).

A voltage corresponding to attraction force=a surface potential of the electrostatic chuck 113–Vdc . . . (1). The attraction force of the substrate W is determined by a potential difference between the surface potential of the electrostatic chuck 113 and the self-bias Vdc. When an RF signal (RF power) is supplied to the substrate support 11 and plasma is generated, migration tends to occur because the substrate W is heated by heat input from the plasma. When the migration occurs, electrons move from the substrate W to the attraction electrode 113a, and the surface potential of the electrostatic chuck 113 decreases. When the surface potential of the electrostatic chuck 113 decreases, according to equation (1), the voltage corresponding to the attraction force decreases and the attraction force of the substrate W decreases.

(b) In a case where negative charges are supplied to the attraction electrode 113a (HV minus attraction), the first DC signal generated by the first DC generator 32a applies a negative direct current voltage (HV voltage) to the attraction electrode 113a. As a result, for example, a HV voltage of −2.0 kV is supplied to the attraction electrode 113a. When a negative direct current voltage is applied to the attraction electrode 113a, the electrons that are to be obtained by the substrate W from the plasma are repelled, so that migration can be suppressed. Accordingly, even after the time elapses as illustrated in the horizontal axis in (b) of FIG. 4, as indicated by the voltage (potential) on the vertical axis, the increase in the surface potential of the electrostatic chuck 113 can be suppressed to be a small amount, and the decrease in the attraction force of the substrate W can be suppressed in accordance with the equation (1).

In a case where positive charges are supplied to the attraction electrode 113a in (a) of FIG. 4, migration tends to occur if the temperature of the electrostatic chuck 113 is high. As a result, the attraction force of the electrostatic chuck 113 decreases and the amount of the leakage of the He gas increases. When negative charges are supplied to the attraction electrode 113a as in the case of (b) of FIG. 4, migration can be prevented from being occurred even if the temperature of the electrostatic chuck 113 is high. As a result, the amount of the leakage of the He gas can be maintained to be a small amount because the attraction force of the electrostatic chuck 113 can be maintained.

In the following plasma processing methods according to the embodiments, dielectric polarization occurs in the substrate W and the attraction electrode 113a without being affected by the decrease in volume resistivity due to the temperature rise in the electrostatic chuck 113, and the effect of migration can be reduced.

[Plasma Processing Method]

Figure 6:
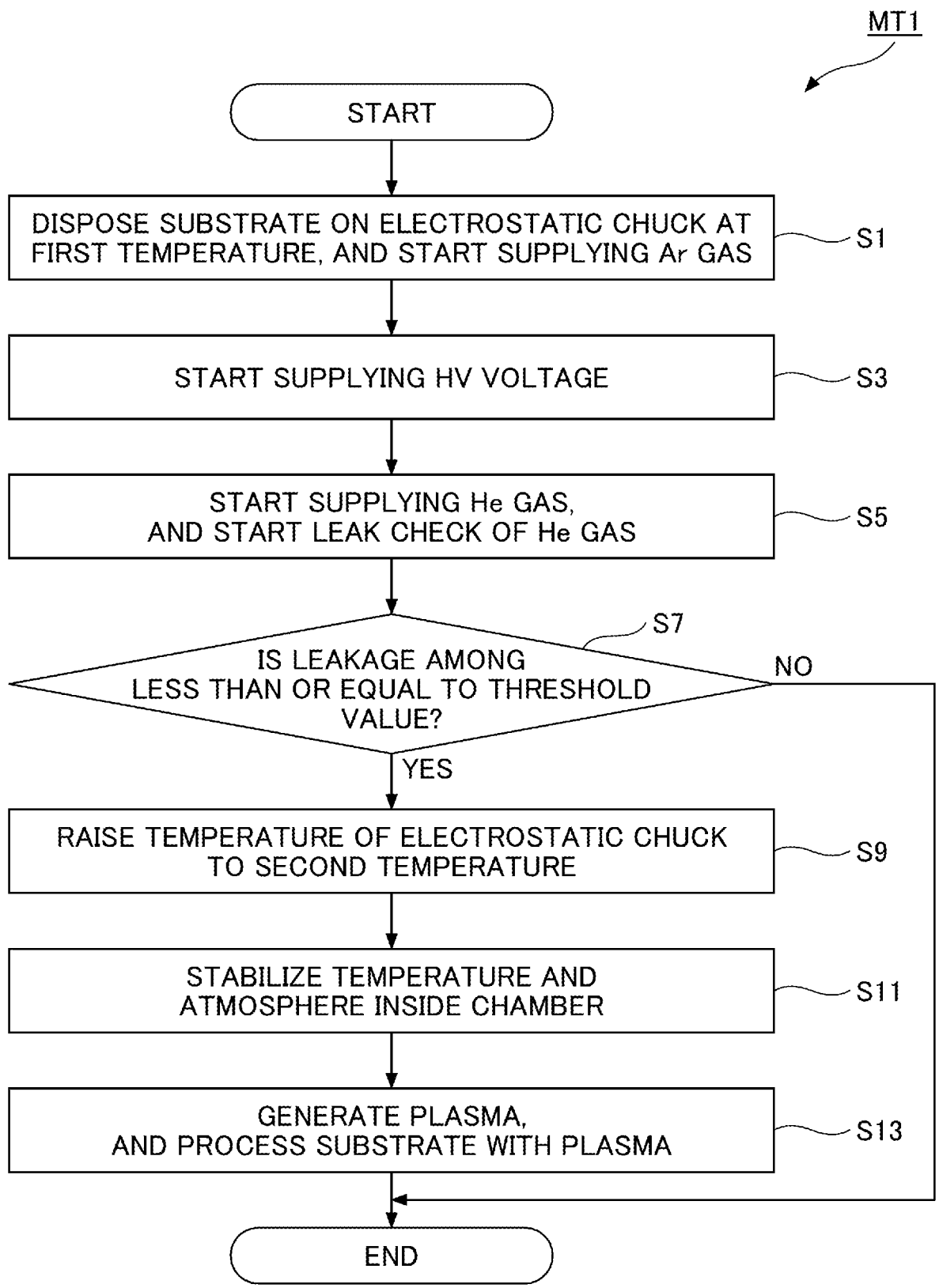
FIG. 6 is a flowchart illustrating an example of a plasma processing method according to an embodiment.

First, a plasma processing method MT1 according to an embodiment is described with reference to FIG. 6 and FIG. 7. FIG. 6 is a flow chart illustrating an example of the plasma processing method MT1 according to the embodiment. FIG. 7 is a time chart illustrating an example of the plasma processing method MT1 according to the embodiment. The plasma processing method according to the embodiment is controlled by the controller 2.

Upon starting the method MT1 of FIG. 6, the controller 2 brings the substrate W into the plasma processing chamber 10 of the plasma processing apparatus 1 and places the substrate W on the electrostatic chuck 113 at a first temperature. The first temperature is, for example, lower than 100° C. After loading the substrate W, the controller 2 supplies Ar gas (turns on the supply of the Ar gas) to the plasma processing chamber 10 to stabilize inside the plasma processing chamber 10 (step S1). An inert gas other than the Ar gas may be supplied, instead of Ar gas.

In Step A of the time chart in FIG. 7, the substrate is brought into the plasma processing chamber 10 at time $t_0$, Ar gas is supplied between time $t_0$ and time $t_1$, and the inside of the plasma processing chamber 10 is stabilized until time $t_1$. By supplying Ar gas, the attraction force of the substrate W to the electrostatic chuck 113 can be ensured when the HV voltage is turned on in Step B.

Referring back to FIG. 6, next, the controller 2 starts supplying HV voltage (turns on the supply of the HV voltage) to the attraction electrode 113a (step S3). Positive or negative charges may be supplied to the attraction electrode 113a. As a result, the substrate W is electrostatically attracted to the electrostatic chuck 113.

In Step B of the time chart of FIG. 7, HV voltage is turned on by supplying a first DC signal between time $t_1$ and time $t_2$ to supply positive charges to the attraction electrode 113a.

Referring back to FIG. 6, subsequently, the controller 2 starts supplying He gas (turns on the supply of the He gas) from the He gas source 119. As a result, the He gas is supplied to the gap between the substrate W and the electrostatic chuck 113. Next, the controller 2 starts the leak check of the He gas based on the detection result by the flow rate monitoring device 123 (step S5). In the leak check of the He gas, an amount of the He gas supplied to the gap between the substrate support surface 111a and the back surface of the substrate W and leaked from the gap between the substrate support surface 111a and the back surface of the substrate W is detected by the flow rate monitoring device 123, as a leak amount (flow rate). Instead of the leak amount of the He gas, the pressure between the substrate support surface 111a and the back surface of the substrate W may be detected. During the leak check, the supply of the He gas is turned on, and the supply of the He gas is turned off after a predetermined time period elapses. If the He gas is leaking, the pressure between the substrate support surface 111a and the back surface of the substrate W decreases when the supply of the He gas is turned off. Accordingly, the He gas is supplied from the He gas source 119 that is tuned on again at a larger flow rate so as to adjust the pressure. Thus, when the He gas is leaking, the flow rate of He gas detected by the flow rate monitoring device 123 is greater than a flow rate of He gas in a case where the He gas is not leaking. Accordingly, if the detected flow rate of He gas exceeds a preset threshold value, it can be determined that the He gas is leaking. The leak check determines, for example, whether a leak amount that is larger than or equal a predetermined flow rate is detected for a predetermined time period (for example, 2 seconds).

As a result of the leak check of the He gas in step S5, the controller 2 determines whether the leak amount of the He gas is smaller than or equal to a threshold value (step S7). If the leak amount of the He gas is larger than the threshold value, the controller 2 stops processing. Upon determining that the leak amount of the He gas is smaller than or equal to the threshold value, the controller 2 increases the temperature of the electrostatic chuck 113 from the first temperature to the second temperature. The first temperature is lower than the second temperature, e.g., lower than 100° C.

The volume resistivity of the ceramic plate of the electrostatic chuck 113 decreases as the temperature of the electrostatic chuck 113 becomes high temperature. Migration of electrons accumulated in the substrate W to the ceramic plate is promoted by lowering the volume resistivity of the ceramic plate. In this disclosure, migration can be prevented from being occurring by controlling the temperature of the electrostatic chuck 113 to be lower than 100° C. during the leak check. As a result, the decrease in the attraction force of the substrate W can be prevented.

In Step C of the time chart in FIG. 7, it is indicated that the leak check of the He gas is performed once at time $t_3$. However, the leak amount of the He gas is continuously detected by the flow monitoring device 123.

When the leak amount is smaller than or equal to the threshold value, the controller 2 raises the temperature of the electrostatic chuck 113 (step S9). Namely, the controller 2 heats the electrostatic chuck 113 to a second temperature higher than the first temperature.

In Step D of the time chart in FIG. 7, the temperature of the electrostatic chuck 113 is gradually increased between time $t_4$ and time $t_5$, so that the temperature of the electrostatic chuck 113 becomes a high temperature. The second temperature (high temperature) is, for example, higher than or equal to 100 degrees ° C. The controller 2 may continuously raise the temperature to the second temperature higher than the first temperature. Alternatively, the controller 2 may stepwise raise the temperature to the second temperature higher than the first temperature. The inclination of the temperature of the electrostatic chuck 113 between time t 4 and time t in in the graph of FIG. 7 is an example. The inclination may be set appropriately depending on the structure of the electrostatic chuck 113, the heat capacity of the electrostatic chuck 113 and the plasma processing apparatus 1, and the plasma heat input.

In Step D, the supply of Ar gas is gradually stopped, and, subsequently, the supply of process gas is started.

Referring back to FIG. 6, the controller 2, subsequently, stabilizes the temperature and atmosphere in the plasma processing chamber 10 (step S11). In step E of the time chart in FIG. 7, the temperature in the plasma processing chamber 10 is stabilized between time $t_5$ and time $t_6$. In Step F, the atmosphere in the plasma processing chamber 10 is stabilized between time $t_6$ and time $t_7$ according to the process conditions.

Referring back to FIG. 6, the controller 2 generates plasma in the plasma processing chamber 10 and plasma processes the substrate W after a predetermined time period has elapsed after the temperature of the electrostatic chuck 113 reaches the second temperature (step S13). Subsequently, the process is terminated.

In the example of FIG. 7, the source RF signal (HF Power) is supplied (turned on) based on the process recipe at time $t_7$ in Step G after a predetermined time period has elapsed after reaching the second temperature, and the bias RF signal (LF Power) is supplied slightly later than time $t_7$. As a result, plasma of the process gas is generated and the substrate W is plasma-processed. Plasma processing of the substrate W includes etching, film formation, and the like.

FIGS. 8A through 8D illustrate examples of the results of the leak check of He gas in the plasma processing method according to an embodiment. The vertical axis in FIG. 8A indicates the temperature of the electrostatic chuck 113 according to a reference example, and the vertical axis in FIG. 8B indicates the flow rate of He gas according to the reference example. The horizontal axis represents time in each of FIG. 8A and FIG. 8B. The vertical axis in FIG. 8C indicates the temperature of the electrostatic chuck 113 according to an embodiment, and the vertical axis in FIG. 8D indicates the flow rate of He gas according to the embodiment. The horizontal axis represents time in each of FIG. 8C and FIG. 8D.

Figure 8A:
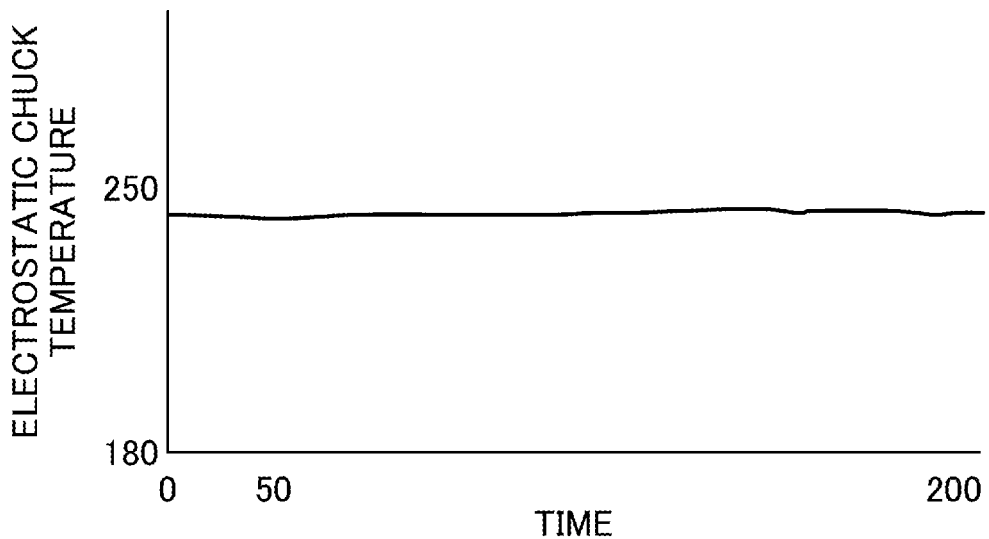
FIGS. 8A-8D are diagrams illustrating examples of results of leak check of an He gas in the plasma processing method.

In the reference example of FIG. 8A, the temperature of the electrostatic chuck 113 was controlled to be approximately 250° C. from the beginning (time 0). In the embodiment of FIG. 8C, the temperature of the electrostatic chuck 113 was initially controlled to be lower than 100° C. (time 0), and, subsequently, the temperature of the electrostatic chuck 113 was controlled to be approximately 250° C.

Figure 8B:
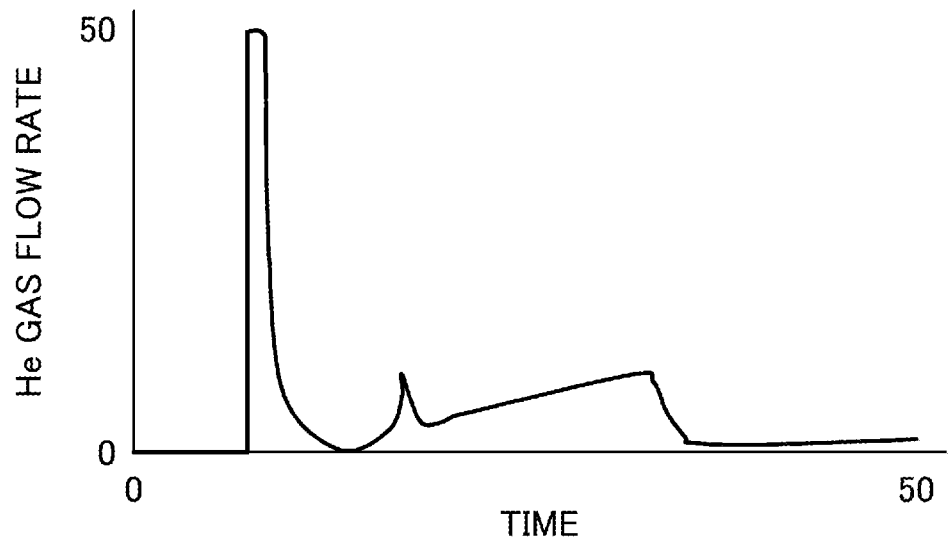
Figure 8C:
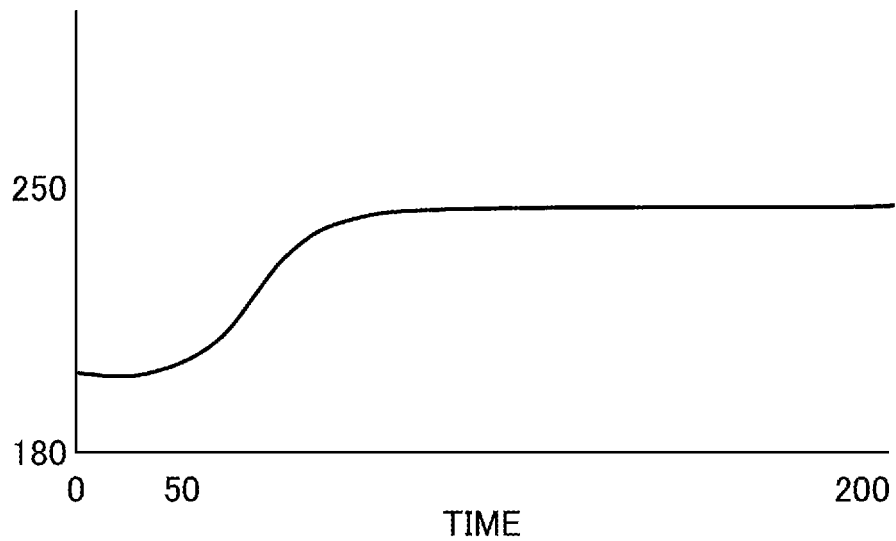
Figure 8D:
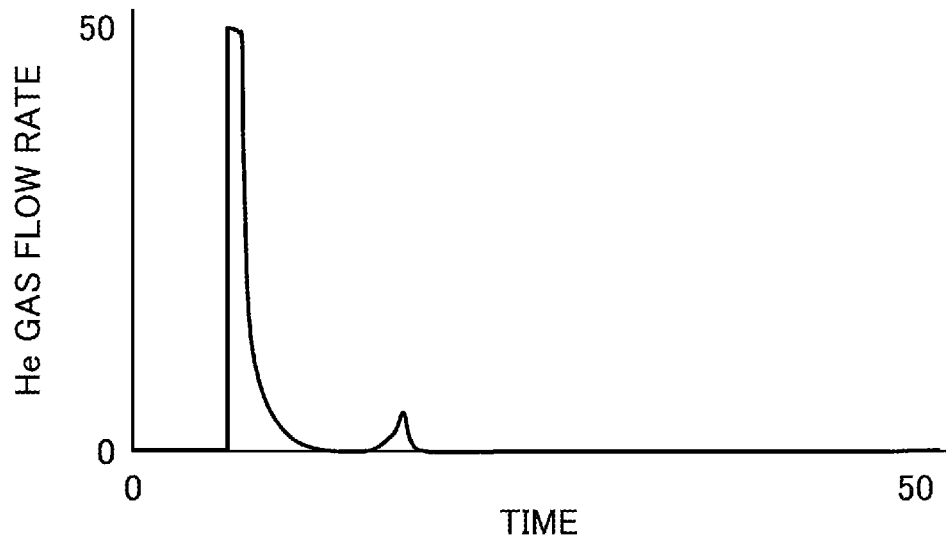

According to the results of the reference example in FIG. 8B, the leak amount (flow rate) was large when the supply of the He gas was turned on and off, and the supply of the He gas was turned on again. In contrast, in the results of the embodiment in FIG. 8D, the leak amount (flow rate) was small when the supply of the He gas is turned on and off, and the supply of the He gas was turned on again.

As described above, with the plasma processing method according to the first embodiment, dielectric polarization occurs in the substrate W and the attraction electrode 113a without being affected by the decrease in the volume resistivity due to the temperature rise of the electrostatic chuck 113, so that the effect of migration can be reduced.

Figure 10:
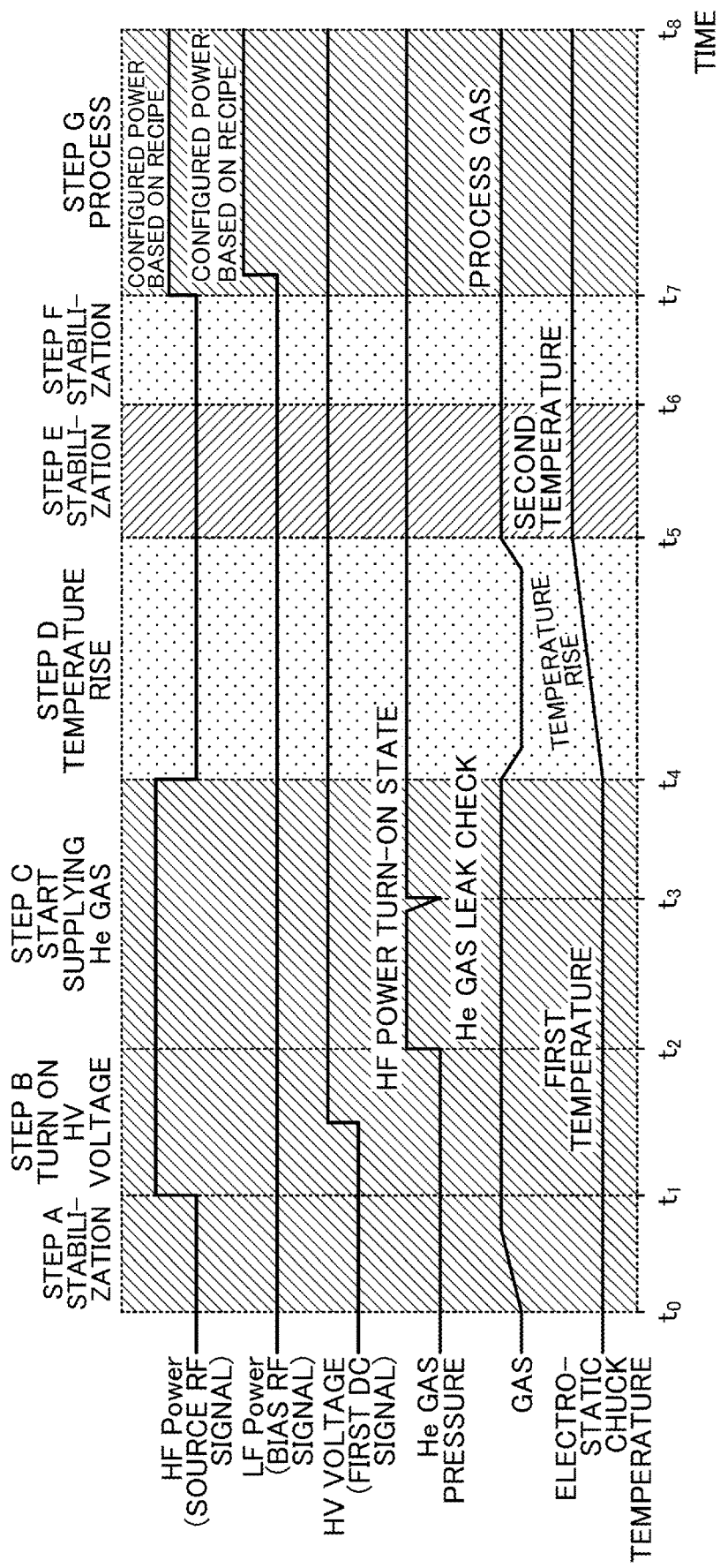
FIG. 10 is a time chart illustrating an example of the plasma processing method according to the embodiment.

Next, another example of a plasma processing method is described with reference to FIG. 9 and FIG. 10. FIG. 9 is a flow chart illustrating an example of the plasma processing method according to an embodiment. FIG. 10 is a time chart illustrating an example of the plasma processing method according to the embodiment. If the step number of the process indicated in FIG. 9 is the same as the step number of the process indicated in FIG. 6, the process indicated in FIG. 9 is the same as the process indicated in FIG. 6.

Upon starting the method MT2, the controller 2 brings the substrate W into the plasma processing chamber 10 and places the substrate W on the electrostatic chuck 113 at the first temperature. The controller 2 supplies Ar gas (turns on the supply of the Ar gas) to the plasma processing chamber 10 (step S1).

In Step A of the time chart in FIG. 10, the substrate W is brought into the plasma processing chamber 10 at time to, the Ar gas is supplied between time to and time $t_1$, and, subsequently, the chamber is stabilized until time $t_1$.

Referring back to FIG. 9, the controller 2 supplies a source RF signal (HF Power) (turns on the supply of the source RF signal) to generate plasma of the Ar gas (step S21). According to this, the attraction force of the substrate W to the electrostatic chuck 113 can be ensured by the plasma of the Ar gas. In addition, plasma is generated before HV voltage is applied, and particles in the plasma processing chamber 10 can be prevented from being drawn to the substrate W when the HV voltage is applied by the plasma.

Referring back to FIG. 9, subsequently, the controller 2 starts supplying the HV voltage (turns on the supply of the HV voltage) to the attraction electrode 113a (step S3). The HV voltage may supply positive charges or negative charges to the attraction electrode 113a. As a result, the substrate W is electrostatically attracted to the electrostatic chuck 113.

In Step B of the time chart in FIG. 10, a source RF signal is supplied at time $t_1$ to turn on HF power, and a first DC signal is supplied between time $t_1$ and time $t_2$ to turn on HV voltage, so that positive charges are supplied to the attraction electrode 113a.

Referring back to FIG. 9, the controller 2, subsequently, starts supplying He gas (turns on the supply of the He gas) and supplies the He gas to the gap between the substrate support surface 111a and the back surface of the substrate W. Next, the controller 2 starts the leak check of the He gas based on the detection result by the flow monitoring device 123 (step S5). The leak check of the He gas detects the leak amount of the He gas (flow rate) supplied to the gap between the substrate support surface 111a and the back surface of the substrate W in a state in which the source RF signal is supplied and the Ar gas plasma generated by the HF power. The pressure between the substrate support surface 111a and the back surface of the substrate W may be detected instead of the leak amount of the He gas. When He gas is leaking, the flow rate of the He gas detected by the flow monitoring device 123 is greater than a flow rate of He gas when the He gas is not leaking. Accordingly, if the detected flow rate of the He gas exceeds a preset threshold value, it can be determined that the He gas is leaking.

Based on the result of the leak check of the He gas, the controller 2 determines whether the leak amount of the He gas is smaller the threshold value (step S7). If the leak amount of the He gas is larger than the threshold value, the controller 2 stops processing. Upon determining that the leak amount of the He gas is smaller than or equal to the threshold value, the controller 2 controls the temperature of the electrostatic chuck 113, so that the temperature of the electrostatic chuck 113 becomes the second temperature that is the high temperature from the first temperature that is the low temperature. The low temperature is, for example, a temperature that is lower than 100° C.

When the leak amount is smaller than or equal to the threshold value, the controller 2 stops the supply of the source RF signal, turns off the HF power (step S23), and raises the temperature of the electrostatic chuck 113 to the second temperature (step S9).

In Step D of the time chart in FIG. 10, the supply of the source RF signal (HF Power) is stopped at time $t_4$, and the temperature of the electrostatic chuck 113 is gradually increased between time $t_4$ and time $t_5$ so that the temperature of the electrostatic chuck 113 becomes the second temperature. The second temperature is, for example, higher than 100° C. In Step D, the supply of Ar gas is stopped, and, subsequently, the supply of process gas is started.

Referring back to FIG. 9, the controller 2, subsequently, stabilizes the temperature and atmosphere in the plasma processing chamber 10 (step S11). Subsequently, the controller 2 generates plasma in the plasma processing chamber 10 after a predetermined time period has elapsed after the temperature of the electrostatic chuck 113 reached the second temperature, and processes the substrate W (step S13). Subsequently, the process is terminated. In Steps E and F of the time chart in FIG. 10, the temperature and atmosphere in the plasma processing chamber 10 are stabilized between times $t_5$ and $t_7$.

In the example of FIG. 10, based on the process recipe, the source RF signal (HF Power) is supplied at time $t_7$, the bias RF signal (LF Power) is supplied slightly later than time $t_7$, the plasma of the process gas is generated, and the substrate W is processed.

As described above, with the plasma processing method according to the embodiment, dielectric polarization occurs without being affected by the decrease in volume resistivity due to the temperature rise of the electrostatic chuck 113, so that the influence of migration can be reduced.

In addition, the source RF signal (HF Power) is applied to the attraction electrode 113a prior to the process of attracting the substrate W to the electrostatic chuck 113, and the application of the source RF signal is stopped after the process of determining whether the flow rate or pressure exceeds a predetermined threshold value. Accordingly, plasma is generated before the HV voltage is supplied, and the attraction force of the substrate W to the electrostatic chuck 113 can be ensured by the plasma. In addition, particles in the plasma processing chamber 10 can be prevented from being drawn toward the substrate W when the HV voltage is applied.

In the embodiments, particles are prevented from being generated in the substrate W by turning on the source RF signal in step S21 of FIG. 9. However, the embodiments are not limited to this. The bias RF signal may be turned on or the source RF signal and the bias RF signal may be turned on in step S21. In these cases, particles can be prevented from being generated in the substrate W. When the source RF signal is supplied, the attraction force of the substrate W is smaller than the attraction force of the substrate W in a case where the bias RF signal is used. However, less damage is caused by the sputtering effect. Conversely, when the bias RF signal is supplied, the attraction force of the substrate W is larger than the attraction force of the substrate W in a case where the source RF signal is supplied. However, the substrate W is more likely to be damaged by the sputtering effect.

As described above, according to the plasma processing method and the plasma processing apparatus of the embodiments, the substrate W is electrostatically attracted by the electrostatic chuck 113 at a low temperature at which the effect of the migration is not significant, and the electrostatic chuck 113 is heated to a high temperature according to the process conditions, after dielectric polarization occurs. As a result, the transfer of electric charges can be suppressed when the substrate W is attracted to the electrostatic chuck 113, a failure in attracting the substrate W can be prevented, and the substrate W can be attracted to the electrostatic chuck 113 for a desired time period in the subsequent process.

The plasma processing method and plasma processing apparatus in the embodiments are examples and not restrictive in all respects. The embodiments can be modified and improved in various forms without departing from the scope and gist of the attached claims. The matters described in the above-described embodiments can be replaced with another configuration to the extent that there is no contradiction, and the matters described in the above-described embodiments can be combined with another configuration to the extent that there is no contradiction.

The plasma processing apparatus of the present disclosure is applicable to any type of apparatus including an Atomic Layer Deposition (ALD) apparatus, a Capacitively Coupled Plasma (CCP) apparatus, an Inductively Coupled Plasma (ICP) apparatus, a Radial Line Slot Antenna (RLSA) apparatus, an Electron Cyclotron Resonance Plasma (ECR) apparatus, and a Helicon Wave Plasma (HWP) apparatus.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing method comprising:
   (a) placing a substrate on an electrostatic chuck at a first temperature, the electrostatic chuck being disposed in a plasma processing chamber;
   (b) electrostatically attracting the substrate to the electrostatic chuck;
   (c) starting supply of a heat transfer gas between the substrate and the electrostatic chuck;
   (d) detecting a flow rate of the heat transfer gas or a pressure between the substrate and the electrostatic chuck;
   (e) determining whether the flow rate or the pressure exceeds a predetermined threshold value;
   (f) raising a temperature of the electrostatic chuck until the temperature of the electrostatic chuck becomes a second temperature, the second temperature being higher than the first temperature; and
   (g) generating plasma in the plasma processing chamber.

2. The plasma processing method according to claim 1, wherein the raising continuously increases the temperature to the second temperature.

3. The plasma processing method according to claim 1, wherein the raising stepwise increases the temperature to the second temperature.

4. The plasma processing method according to claim 1, the generating generates the plasma in the plasma processing chamber after a predetermined time period elapses after the temperature of the electrostatic chuck reaches the second temperature.

5. The plasma processing method according to claim 1, further comprising:
   applying high frequency power to an electrode disposed in the plasma processing chamber prior to the electrostatically attracting; and
   stopping the application of the high frequency power after the determining.

6. The plasma processing method according to claim 5, wherein the high frequency power is at least one of a source radio frequency (RF) signal for generating plasma or a bias RF signal with a frequency lower that is than a frequency of the source RF signal.

7. The plasma processing method according to claim 1, further comprising:
   prior to the generating, stabilizing an atmosphere in the plasma processing chamber after the raising.

8. The plasma processing method according to claim 1, wherein the detecting detects the flow rate or the pressure at a time at which the heat transfer gas is supplied again after the supply of the heat transfer gas is stopped after a predetermined time period elapses from timing at which the starting starts the supply of the heat transfer gas between the substrate and the electrostatic chuck.

9. The plasma processing method according to claim 1, wherein, upon determining that the flow rate or the pressure is less than or equal to the predetermined threshold value, the raising raises the temperature of the electrostatic chuck.

10. The plasma processing method according to claim 9, wherein, during a time interval in which the flow rate or the pressure exceeds the predetermined threshold value, the raising does not raise the temperature of the electrostatic chuck.

11. A plasma processing apparatus comprising:
    a plasma processing chamber;
    an electrostatic chuck disposed inside the plasma processing chamber; and
    a controller,
    wherein the controller is configured to execute the following steps:
    placing a substrate on an electrostatic chuck at a first temperature, the electrostatic chuck being disposed in a plasma processing chamber;
    electrostatically attracting the substrate to the electrostatic chuck;
    starting supply of a heat transfer gas between the substrate and the electrostatic chuck;
    detecting a flow rate of the heat transfer gas or a pressure between the substrate and the electrostatic chuck;
    determining whether the flow rate or the pressure exceeds a predetermined threshold value;
    raising a temperature of the electrostatic chuck until the temperature of the electrostatic chuck becomes a second temperature, the second temperature being higher than the first temperature; and
    generating plasma in the plasma processing chamber.

* * * * *